United States Patent
Ikhtiar et al.

(10) Patent No.: US 11,251,366 B2
(45) Date of Patent: Feb. 15, 2022

(54) OXIDE INTERLAYERS CONTAINING GLASS-FORMING AGENTS

(71) Applicant: Samsung Electronics Co., Ltd., Gyeonggi-do (KR)

(72) Inventors: Ikhtiar, San Jose, CA (US); Jaewoo Jeong, San Jose, CA (US); Mohamad Towfik Krounbi, San Jose, CA (US); Xueti Tang, Fremont, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 102 days.

(21) Appl. No.: 16/800,779

(22) Filed: Feb. 25, 2020

(65) Prior Publication Data

US 2021/0159402 A1 May 27, 2021

Related U.S. Application Data

(60) Provisional application No. 62/939,366, filed on Nov. 22, 2019.

(51) Int. Cl.
*H01L 43/08* (2006.01)
*H01L 43/10* (2006.01)
*H01L 43/12* (2006.01)

(52) U.S. Cl.
CPC ............ *H01L 43/10* (2013.01); *H01L 43/08* (2013.01); *H01L 43/12* (2013.01)

(58) Field of Classification Search
CPC .......... H01L 43/08; H01L 43/10; H01L 43/12
USPC ........................................................ 257/421
See application file for complete search history.

(56) References Cited

U.S. PATENT DOCUMENTS

| | | | |
|---|---|---|---|
| 9,349,945 B2 | 5/2016 | Sandhu | |
| 9,583,697 B2 | 2/2017 | Kim | |
| 9,601,687 B2 | 3/2017 | Park | |
| 9,985,200 B2 | 5/2018 | Lee | |
| 10,121,960 B2 | 11/2018 | Chepulskyy | |
| 10,193,056 B2 | 1/2019 | Beach | |
| 10,283,246 B1 | 5/2019 | Shum | |
| 10,283,701 B1 | 5/2019 | Ikhtiar | |
| 10,347,824 B2 | 7/2019 | Choi | |
| 2008/0062581 A1* | 3/2008 | Parkin | G01R 33/093 360/324.11 |

(Continued)

FOREIGN PATENT DOCUMENTS

CN 105957961 11/2019

OTHER PUBLICATIONS

Bedau et al., Spin-Transfer Pulse Switching: From the Dynamic to the Thermally Activated Regime, Applied Physics Letters, 97, 262502, 2010.

(Continued)

*Primary Examiner* — Jami Valentine Miller
(74) *Attorney, Agent, or Firm* — Lewis Roca Rothgerber Christie LLP

(57) ABSTRACT

A magnetic junction usable in a magnetic device is described. The magnetic junction includes a free layer and an oxide interlayer on the free layer. The oxide interlayer includes at least one glass-forming agent. In some aspects, the magnetic junction includes a reference layer and a nonmagnetic spacer layer being between the reference layer and the free layer. The free layer is between the nonmagnetic spacer layer and the oxide interlayer.

17 Claims, 5 Drawing Sheets

(56) References Cited

U.S. PATENT DOCUMENTS

| | | | |
|---|---|---|---|
| 2014/0268991 A1* | 9/2014 | Hu | H01L 45/142 |
| | | | 365/148 |
| 2015/0303374 A1 | 10/2015 | Siddik | |
| 2018/0175286 A1* | 6/2018 | Sato | G11C 11/161 |

OTHER PUBLICATIONS

Graf et al., Simple Rules for the Understanding of Heusler Compounds, Progress in Solid State Chemistry, 39, 2011.

* cited by examiner

OXIDE INTERLAYERS CONTAINING GLASS-FORMING AGENTS

CROSS REFERENCE TO OTHER APPLICATIONS

This application claims priority to U.S. Provisional Patent Application No. 62/939,366 entitled OXIDE CAP LAYER CONTAINING GLASS-FORMING ELEMENT filed Nov. 22, 2019 which is incorporated herein by reference for all purposes.

BACKGROUND OF THE INVENTION

Magnetic memories such as magnetic random access memories (MRAMs) store information utilizing magnetic materials as an information recording medium. For example, a magnetic tunneling junction (MTJ) may be used in an MRAM, such as a spin transfer torque MRAM (STT-MRAM). The MTJ typically resides on a substrate and includes a reference layer, a free layer and a tunneling barrier layer between the reference and free layers. The reference and free layers are magnetic. The magnetic moment of the reference layer is fixed, or pinned, in a particular direction. The free layer has a changeable magnetic moment. A bottom contact below the MTJ and a top contact on the MTJ are used to drive current through the MTJ in a current-perpendicular-to-plane (CPP) direction in an STT-MRAM. When a sufficient current is driven in one direction perpendicular-to-plane (e.g. top to bottom), the free layer magnetic moment switches to be parallel to that of the reference layer. When a sufficient current is driven in the opposite direction (e.g. bottom to top), the free layer magnetic moment switches to be antiparallel to that of the reference layer. Different magnetic configurations correspond to different magnetoresistances and thus different logical states (e.g. a logical "0" and a logical "1") of the MTJ.

Because of their potential for use in a variety of applications, research in magnetic memories is ongoing. Accordingly, what is needed is a method and system that may improve the performance of magnetic junctions.

BRIEF DESCRIPTION OF THE DRAWINGS

Various embodiments of the invention are disclosed in the following detailed description and the accompanying drawings.

DETAILED DESCRIPTION

Figure 1:
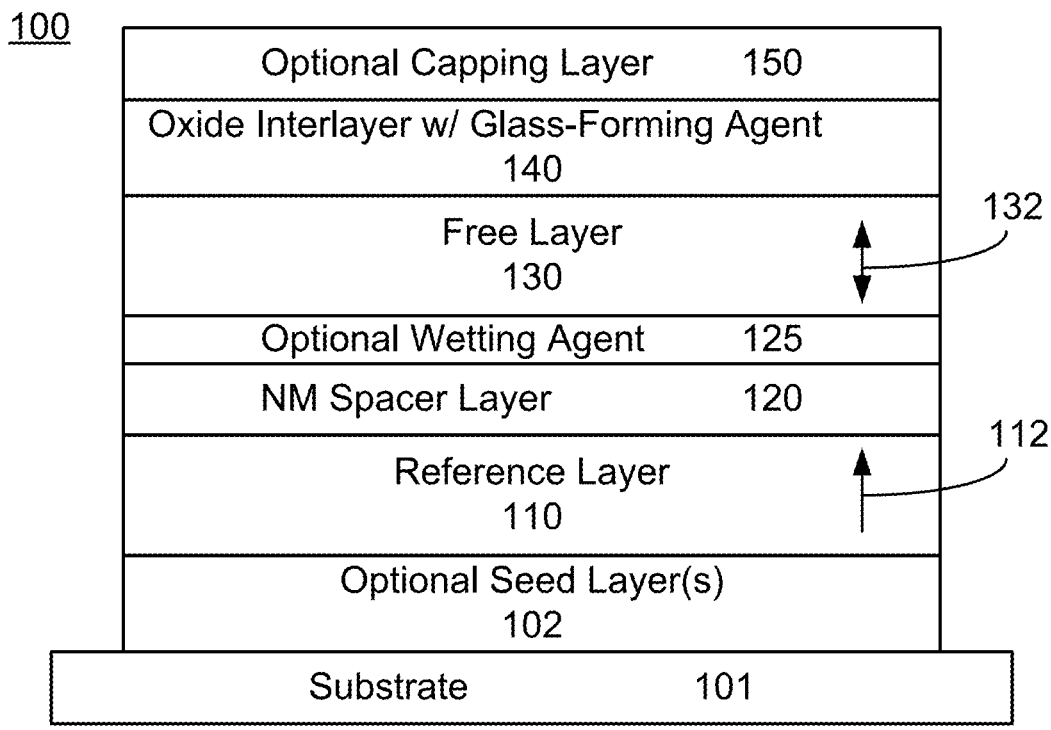
FIG. 1 depicts an embodiment of a magnetic junction having an oxide interlayer including a glass-forming agent and usable in magnetic devices such as a magnetic memory programmable using spin transfer torque.

The invention can be implemented in numerous ways, including as a process; an apparatus; a system; a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The exemplary embodiments are described in the context of particular methods, particular magnetic junctions and magnetic memories having certain components. The techniques described herein are consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, theoretical explanations of the behavior of the method and system are made based upon this current understanding of spin transfer, magnetic anisotropy and other physical phenomena. However, the techniques described herein are not dependent upon a particular physical explanation. The embodiments are described in the context of a structure having a particular relationship to the substrate. However, the embodiments are consistent with other structures. In addition, the embodiments are described in the context of certain layers being synthetic and/or simple. However, one of ordinary skill in the art will readily recognize that the layers could have another structure. Furthermore, the techniques are described in the context of magnetic junctions and/or substructures having particular layers. However, magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the techniques may be used. In addition, various embodiments are described herein. The components described may be combined in manners not shown and not inconsistent with the method and system.

FIG. 1 depicts an embodiment of magnetic junction 100. For clarity, FIG. 1 is not to scale. Magnetic junction 100 may be used in a magnetic device such as a STT-MRAM, spin-orbit torque MRAM (SOT-MRAM), logic devices, other integrated circuits and, therefore, in a variety of electronic devices. Magnetic junction 100 is formed on substrate 101 and includes optional seed layer(s) 102, reference layer 110 having a magnetic moment 112, nonmagnetic spacer layer 120, optional wetting agent 125, free layer 130 having magnetic moment 132, oxide interlayer 140 and optional capping layer 150. In some embodiments, capping layer 150 is a metallic layer. A bottom contact and a top contact are not shown but may be formed. Similarly, polarization enhancement and other layers may be present but are not shown for simplicity. As can be seen in FIG. 1, magnetic junction 100 is a bottom pinned magnetic junction. Thus, reference layer 110 is closer to the underlying substrate (not shown in FIG. 1) than free layer 130.

Reference layer 110 is magnetic. In the embodiment shown, reference layer 110 has a high perpendicular magnetic anisotropy. The perpendicular magnetic anisotropy energy for reference layer 110 is, therefore, greater than the out-of-plane demagnetization energy of reference layer 110. Thus, reference layer magnetic moment 112 is oriented perpendicular to plane. In other embodiments, reference layer 110 may not have a high perpendicular magnetic anisotropy. For example, reference layer 110 may have an in-plane magnetic moment in some embodiments. Optional pinning layer(s) (not shown) may be used to fix magnetic moment 112 of reference layer 110. In some embodiments, the optional pinning layer may be an AFM layer or multilayer that pins the magnetization(s) through an exchange-bias interaction. In some embodiments, the optional pinning layer may include high anisotropy magnetic layers (e.g. one or more CoPt layer and/or CoPd layer) coupled through metallic spacer layer that induces antiferromagnetic configuration, hence (as a whole) forming the synthetic antiferromagnetic (SAF) reference layer. However, in other embodiments, the optional pinning layer may be omitted or another structure may be used. In some embodiments, reference layer 110 does not contain glass-forming agent(s) as-deposited.

Nonmagnetic spacer layer 120 is between reference layer 110 and free layer 130. In some embodiments, nonmagnetic spacer layer 120 is a tunneling barrier layer. For example, nonmagnetic spacer layer 120 may be a crystalline MgO layer. In some embodiments in which nonmagnetic spacer layer 120 is a tunneling barrier layer, the resistance of nonmagnetic spacer layer 120 is much higher than the resistance of oxide interlayer 140. However, other material(s) may be used for nonmagnetic spacer layer 120. For example, nonmagnetic spacer layer 120 may be conductive, semiconductive or have another structure.

Free layer 130 may be prepared on a wetting agent, such as an atomically-layered wetting agent 125. Such a wetting agent 125 may include or consist of 3d transition element(s), such as V, Cr, Mn, Fe, Co, and/or Ni), that are exposed to oxygen (e.g. an oxidation treatment) and/or to another gaseous element or compound that provides an analogous wetting function. Formation of wetting agent 125 is performed prior to the free layer deposition. Atomically-layered wetting agent 125 may be deposited or prepared on the nonmagnetic spacer layer 120. In some embodiments, wetting agent 125 is thinner than two atomic layers (e.g. less than two Angstroms thick). This thickness of such wetting agent 125 may allow the presence of a discontinuous layer that allows oxygen atom to be in voids between/among nearest pre-deposited ferromagnetic atoms. In some embodiments, wetting agent 125 may be omitted.

Free layer 130 is magnetic. Therefore, free layer 130 may include or consists of ferromagnetic materials, such as Fe, Co, CoFe, Co-based Heusler alloys and/or or Mn-based Heusler alloys. Other and/or additional materials may be used in some embodiments. For example, in some embodiments, ferromagnetic materials and nonmagnetic materials may be included in free layer 130. In the embodiment shown, free layer 130 has a high perpendicular magnetic anisotropy. The perpendicular magnetic anisotropy energy for free layer 130 is greater than the out-of-plane demagnetization energy of free layer 130. Free layer magnetic moment 132 is, therefore, oriented perpendicular to plane. In other embodiments, free layer 130 may not have a high perpendicular magnetic anisotropy. In some embodiments, free layer 130 is thin. For example, the thickness, t, of free layer 130 may be less than thirty Angstroms in some embodiments. In some such embodiments, free layer 130 is not more than fifteen Angstroms thick. In some embodiments, free layer 130 may be at last four Angstroms and not more than eight Angstroms thick. However, other thicknesses are possible.

In some embodiments, free layer 130 does not contain glass-forming agents, such as boron, as-deposited. This is in contrast to a CoFeB free layer, which includes B as deposited. Thus, free layer 130 may be a boron-free free layer. In other words, free layer 130 is boron-free as-deposited. As such, free layer 130 may not be completely amorphous as-deposited. As-deposited free layer 130 may instead be crystalline or a mixture of nanocrystal and amorphous matrices. As used herein with respect to a free layer, the term "crystalline as-deposited" indicates that the free layer is at least partially crystalline as-deposited. In some embodiments, a free layer that is crystalline as-deposited is majority crystalline (e.g. more than half crystalline or nanocrystals) as-deposited. In some such embodiments, a free layer that is deposited is considered completely crystallized. Although described below in the context of a boron-free free layer, in some embodiments, free layers described herein may be free of other and/or all glass-forming components when deposited. For example, free layer 130 may not include B, C and other glass-forming material(s) that may be used in providing a layer that is amorphous as-deposited. Thus, as used herein, a layer that is termed free of glass-forming components does not include the glass-forming components as-deposited. In some embodiments, however, free layer 130 may include one or more glass-forming agents.

Oxide interlayer 140 is on free layer 130. In some embodiments, oxide interlayer 140 adjoins, or shares an interface with, free layer 130. In some embodiments, one or more intervening layers might be between free layer 130 and oxide interlayer 140. Oxide interlayer 140 is an oxide that includes one or more glass-forming agents. In some embodiments, oxide interlayer 140 is an oxide of one or more metals, such as Mg, Ti, Ta, Zr, Hf, V and/or Nb. In some such embodiments, oxides of Ta, Zr and/or Hf may form part of oxide interlayer 140. Glass-forming agents may include one or more of Si, Be, B, Al, P and Ga. In some embodiments, others glass-forming agents may be used in addition to or instead of Si, Be, B, Al, P and/or Ga. Oxide interlayer 140 includes not more than fifty atomic percent and greater than zero atomic percent of the glass-forming agent(s) in some embodiments. In some embodiments, oxide interlayer 140 includes not more than thirty atomic percent of the glass-forming agent(s). In some embodiments, oxide interlayer 140 includes at least five atomic percent of the glass-forming agent(s). However, other stoichiometries may be possible.

The presence of glass-forming agent(s) allows a material that would otherwise be crystalline to have a more amorphous (e.g. glass-like) structure. Thus, oxide interlayer 140 may be at least partially amorphous. In some embodiments, oxide interlayer 140 is majority (more than half) amorphous. In some embodiments, oxide interlayer 140 may be considered fully amorphous. As used herein in describing oxide layers including glass-forming agent(s), "amorphous" includes partially, majority and fully amorphous. Thus, oxide interlayer 140 includes glass-forming agent(s) and is amorphous.

Oxide interlayer 140 may also be thin. In some embodiments, oxide interlayer 140 is not more than twenty Angstroms thick. In some embodiments, oxide interlayer 140 is less than fifteen Angstroms thick. In some embodiments, oxide interlayer 140 is not more than twelve Angstroms thick. For example, oxide interlayer 140 may be at least six Angstroms thick and not more than twelve Angstroms thick. In some embodiments, oxide interlayer 140 is not more than eight Angstroms thick.

Oxide interlayer 140 may improve the performance of magnetic junction 100. This improvement may have particular utility where free layer 130 is a glass-forming agent-free free layer, such as a boron-free free layer. Oxide interlayer 140 may be smooth, continuous, stable, amorphous and thin. Oxide interlayer 140 may have a reduced roughness, fewer pin holes and/or fewer voids than an oxide layer that does not include the glass forming agent(s). The use of glass-forming agents in oxide layer 140 may be effective in obtaining a more stable amorphous state. Such a high quality thin oxide layer may prevent or suppress elemental diffusion from a layer above oxide interlayer 140 (e.g. metallic capping layer 150) and/or from oxide interlayer 140 itself into free layer 130, or vice versa. For example, diffusion of Ti, Ta, Zr, Hf, V, and/or Nb may be reduced or prevented. Because oxide interlayer 140 is amorphous, a lattice mismatch with respect to an underlying crystalline layer, such as a boron-free free layer 130, may be mitigated or eliminated. A smooth, continuous and stable layer may also improve the electrical properties of the connection it provides. Consequently, a high tunneling magnetoresistance (TMR) and low-damping for free layer 130 maybe obtained. Thus, oxide interlayer 140 may have improved stability, quality (e.g. increased stability and/or fewer or no voids and/or pin holes), and thinness. Oxide interlayer 140 may also reduce interdiffusion between layers 130, 140 and/or 150 and mitigate a lattice mismatch. Properties of free layer 130 and magnetic junction 100 may thus be improved.

Metallic capping layer 150 may be a single metallic capping layer, a bilayer, a trilayer, another multilayer or have another structure. Some material classes usable in metallic capping layer 150 include refractory metals or high melting-point metals (e.g. W, Mo, Ta, Nb, Ru, Ir, Re, Os, Ti, V, Cr, Zr and/or Hf), metallic alloys including glass-forming agent(s), CoFeB or CoFeB-M wherein M includes one or more refractory metals, and a nitride (e.g. TaN, TiN, MoN, VN, MnN, NbN, ZrN, HfN and/or AlN). In some embodiments, at least two of these material classes are combined to form metallic capping layer 150.

Figure 2:
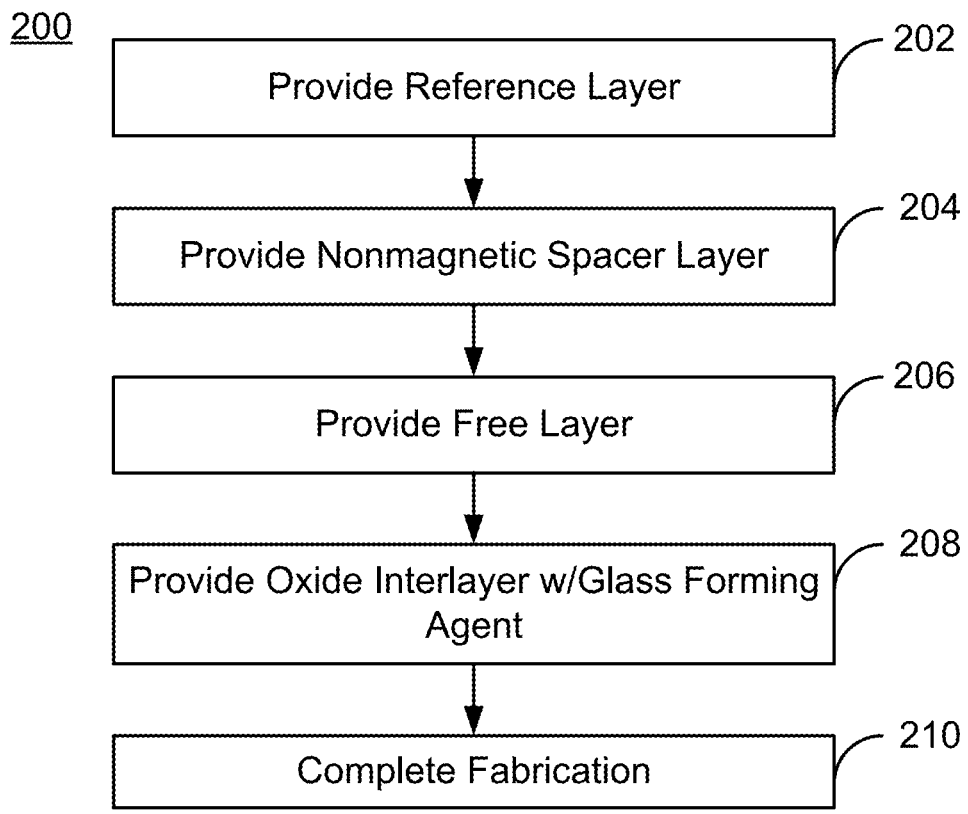
FIG. 2 is a flow chart depicting an embodiment of a method for providing magnetic junction having an oxide interlayer including a glass-forming agent and usable in magnetic devices such as a magnetic memory programmable using spin transfer torque.

FIG. 2 is a flow chart depicting an embodiment of method 200 for providing a magnetic junction having an oxide interlayer including a glass-forming agent and usable in magnetic devices such as a magnetic memory programmable using spin transfer torque. For simplicity, some processes portions may be omitted, performed in another order, include substeps and/or be combined. Further, the method 200 may start after other processes in forming a magnetic junction have been performed. In general, the layers for the magnetic junction are deposited in a stack, the stack may undergo processing such as some annealing, mask layer(s) provided and photolithographically defined on the stack, and the edges of the magnetic junction defined by etching portions of the layers of the stack exposed by the mask(s). Thus, processes in method 200 may be interleaved.

A reference layer is provided, at 202. In some embodiments, 202 includes depositing the material(s) for the reference layer. In some embodiments, the reference layer is a multilayer such as a synthetic reference layer including two magnetic layers sandwiching a nonmagnetic layer. Thus, 202 includes depositing multiple layers in such embodiments. A nonmagnetic spacer layer is provided, at 204. As an example, 204 may include depositing and crystallizing an MgO or other oxide layer(s) through annealing. In some embodiments, other material(s) may be deposited as part of 204.

A free layer is provided, at 206. In some embodiments, step 206 includes providing a wetting layer and depositing the free layer material(s) on the wetting layer. Thus, 206 may include depositing approximately two atomic layers of 3d transition metal(s) and performing a heat treatment to provide the wetting layer. This process would be followed by formation of the free layer. In addition, 206 may include depositing a free layer that is glass-forming agent-free. Thus, the free layer material(s) deposited at 206 may be crystalline and glass-forming agent-free as-deposited. In some embodiments, 206 includes depositing materials such as Fe, Co, CoFe, Co-based Heusler alloys and/or or Mn-based Heusler alloys.

An oxide interlayer including glass-forming agent(s) is provided on the free layer, at 208. In some embodiments, 208 includes depositing metallic layer(s) including the glass-forming agent(s) and oxidizing the layer(s). As discussed above, the edges of the reference layer, nonmagnetic spacer layer, free layer and oxide capping may be defined at some time later in processing. Thus, portions of 202, 204, 206 and 208 may be performed at different times. In some embodiments, 208 includes depositing an oxide layer having the glass-forming elements. Fabrication is completed, at 210. Thus, additional structures, such as metallic capping layer(s), insulating layers, and/or other structures used in the device are manufactured. Other processing such as anneals or other treatments may also be provided.

For example, the magnetic and/or other material(s) for reference layer 110 may be provided, at 202. The oxide or other material(s) for nonmagnetic spacer layer 120 are deposited at 204. Free layer 130 is deposited at 206. Oxide interlayer 140 is deposited at 208. Capping layer 210 may be formed as part of 210. As part of 202, 204, 206, 208 and 210, a mask (e.g. a hard mask) having apertures where the layers for component 110, 120, 130, 140 and 150 are desired to be removed is provided. The mask may be used to etch the exposed portions of the layers for components 110, 120, 130, 140 and 150, and form magnetic junction 100. Thus, magnetic junction 100 may be provided and the benefits thereof achieved.

Figure 3:
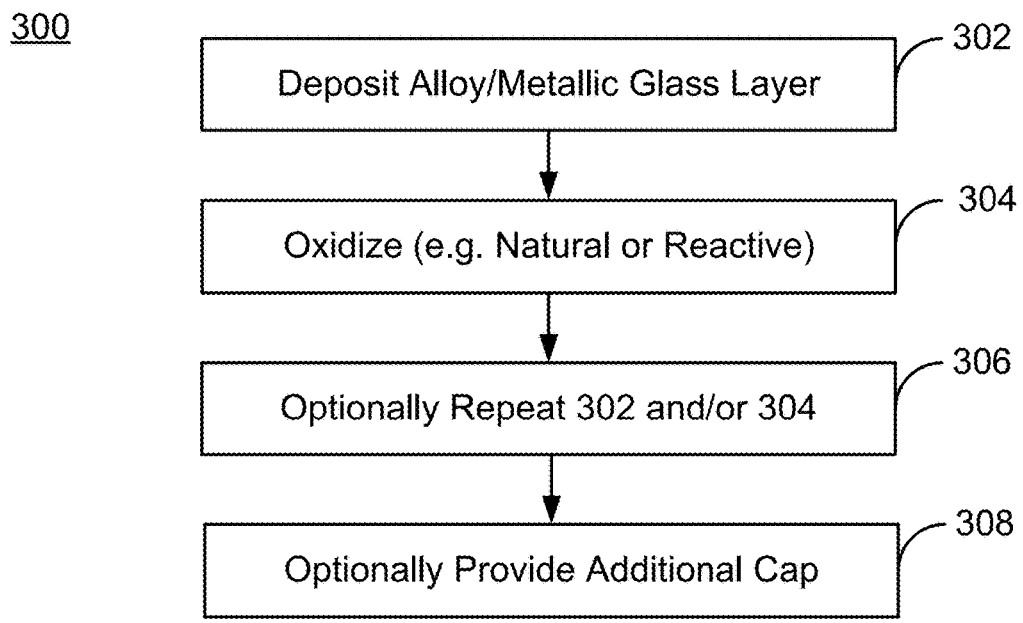
FIG. 3 is a flow chart depicting an embodiment of a method for providing an oxide interlayer including a glass-forming agent and usable in magnetic junctions.
Figure 4A:
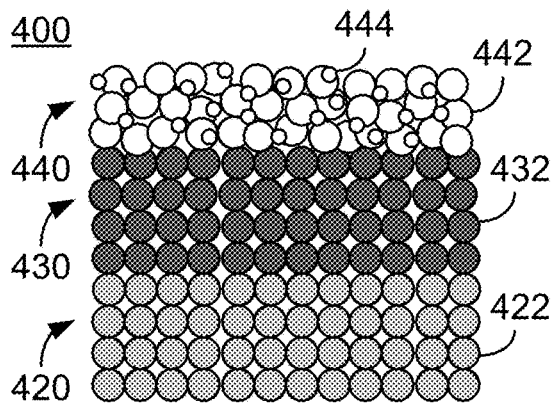
FIGS. 4A-4C depict an embodiment of a portion of a magnetic junction during formation of an oxide interlayer including a glass-forming agent.
Figure 4B:
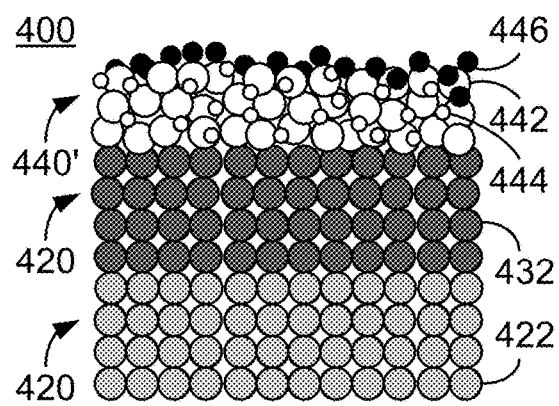
Figure 4C:
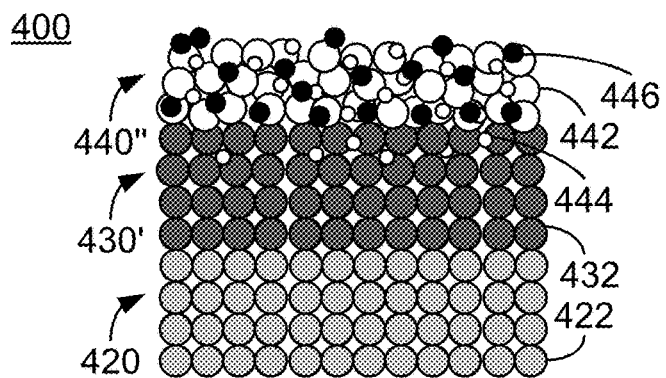

FIG. 3 is a flow chart depicting an embodiment of method 300 for providing an oxide interlayer including a glass-forming agent and usable in magnetic junctions. Method 300 may, therefore, be used in 208 of method 200. For simplicity, some processes may be omitted, performed in another order, include substeps and/or combined. Further, the method 300 may start after other steps in forming a magnetic junction have been performed. FIGS. 4A-4C depict an embodiment of a portion of magnetic junction 400 during formation of an oxide interlayer including a glass-forming agent. Thus, method 300 is described in the context of device 400. However, in some embodiments, other devices may be formed.

A metallic layer including at least one metal and at least one glass-forming agent is deposited, at 302. In some embodiments, the layer is amorphous. In some embodiments, a binary metallic/glass-forming agent layer is deposited at 302. In some embodiments, the layer deposited at 302 is an alloy. In some embodiments, the layer deposited at 302 may be an amorphous binary-alloy layer, such as Mg—X, Ti—X, Ta—X, Zr—X, Hf—X, V-X and Nb—X, where X is glass forming agent. The glass-forming agent is less than or equal to fifty atomic percent of the alloy in some embodiments. In some embodiments, the glass-forming agent is not more than thirty atomic percent of the alloy. In some embodiments, the glass-forming element is at least five atomic percent of the alloy. However, other stoichiometries may be possible.

FIG. 4A depicts a portion of magnetic element 400 after 302. Thus, an underlying nonmagnetic spacer layer 420 and free layer 430 are shown. Individual components 422 (light gray circles) and 432 (dark gray circles) of nonmagnetic spacer layer 420 and free layer 430, respectively, are shown. Although components 422 of nonmagnetic spacer layer 420 are depicted as identical, components 422 may represent multiple different elements, such as Mg and O. Similarly, although components 432 of free layer 430 are shown as identical, components 432 may represent different elements, such as Co and Fe. In the embodiment shown, layers 420 and 430 are crystalline. Thus, free layer 430 may be a glass-forming agent-free (e.g. boron-free) free layer as-deposited. Also depicted in FIG. 4A is amorphous metallic/glass-forming agent layer 440. Metallic/glass-forming agent layer 440 includes metal components 442 (large white circles) and glass-forming agent components 444 (small white circles). In some embodiments components 442 depict a single metal (e.g. Ti) and components 444 depict a single glass-forming agent (e.g. B). In such embodiments, layer 440 is a binary layer. In other embodiments, components 442 may depict multiple metals and/or components 444 depict multiple glass-forming agents.

A natural or reactive oxidation of metallic/glass-forming agent layer 440 is performed, at 304. The oxidation may be performed in a single oxidation step or by multiple oxidation steps. In addition, the deposition at 302 and/or oxidation at 304 may be repeated, at 306, to provide an oxide interlayer of the desired thickness. FIG. 4B depicts magnetic junction 400 after oxidation at 304 and/or 306. Thus, layer 440' includes oxygen 446 (small black circles). In some embodiments, 304 and/or 306 may include annealing magnetic junction 400. In some embodiments, magnetic junction 400 is annealed later in processing. For example, annealing or heat treatment may be performed after the metal capping layer is formed or after device patterning/fabrication. In some embodiments, magnetic junction is heat treated as part of the annealing process at 304/306. FIG. 4C, depicts magnetic junction 400 after heat treating in an anneal or part of oxidation. Thus, oxide interlayer 440" including glass-forming agent 444 is formed. Oxygen 446 is distributed in oxide interlayer 440". Thus, a stable, amorphous oxide interlayer 440" has been formed. In some cases, some glass-forming element 444 may diffuse somewhat into free layer 430'. However, as indicated in FIG. 4C, the diffusion is expected to be relatively minimal. An additional layer, such as a metal capping layer, may also be provided, at 308.

Thus, using method 300, an oxide interlayer such as oxide interlayer 440" may be formed for a magnetic junction such as magnetic junction 400. The oxide interlayer 440" so formed may be thin, stable, amorphous and continuous. The oxide interlayer 440" may be much lower in resistance than nonmagnetic spacer layer 420. For example, oxide interlayer 440" may have a resistance that is negligible in comparison to that of nonmagnetic spacer layer 420. Consequently, properties such as TMR, stability (e.g. reduced diffusion) and magnetic damping may be improved. Thus, performance of the magnetic junction so formed, such as magnetic junction 400, may be improved.

Figure 5:
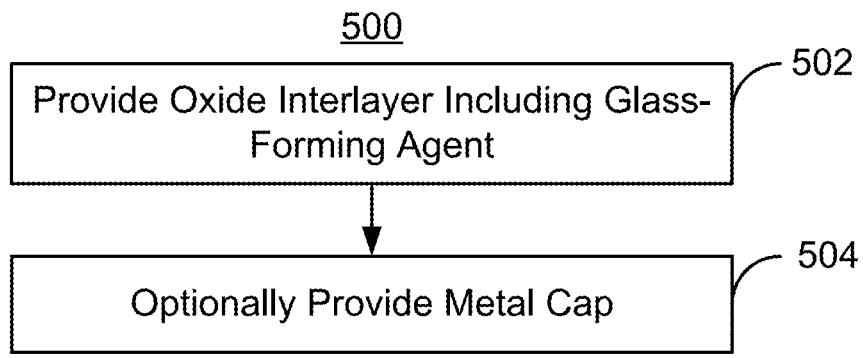
FIG. 5 is a flow chart depicting another embodiment of a method for providing an oxide interlayer including a glass-forming agent and usable in magnetic junctions.

FIG. 5 is a flow chart depicting an embodiment of method 500 for providing an oxide interlayer including a glass-forming agent and usable in magnetic junctions. Method 500 may, therefore, be used in 208 of method 200. For simplicity, some processes may be omitted, performed in another order, include substeps and/or combined. Further, the method 500 may start after other steps in forming a magnetic junction have been performed.

An oxide layer including glass-forming agent(s) may be provided, at 502. In some embodiments, 502 includes sputtering an oxide target (e.g. MgO, TiOx, TaOx, ZrOx, HfOx, VOx, and/or NbOx, where Ox indicates an oxide) containing glass-forming agent(s) (e.g. Si, Be, B, Al, P and/or Ga). The glass-forming agent(s) are less than or equal to fifty atomic percent of the oxide target in some embodiments. In some embodiments, the glass-forming agent(s) are not more than thirty atomic percent of the oxide target. In some embodiments, the glass-forming agent(s) are at least five atomic percent of the oxide target. However, other stoichiometries may be possible. Thus, the oxide interlayer including the glass-forming agent(s) is formed. An additional layer, such as a metal capping layer, may also be provided, at 504.

Using method 500, an oxide interlayer such as oxide interlayer 140 and/or 440" may be formed for a magnetic junction, such as magnetic junction 100 and/or 400. The oxide interlayer formed may be thin, stable, amorphous and continuous. Oxide interlayer 140 and/or 440" may be much lower in resistance than nonmagnetic spacer layer 120. For example, oxide interlayer 140 and/or 440" may have a resistance that is negligible in comparison to that of nonmagnetic spacer layer 120 and/or 420. Consequently, properties such as TMR, stability (e.g. reduced diffusion) and magnetic damping may be improved. Thus, performance of the magnetic junction so formed, such as magnetic junction 100 and/or 400, may be improved.

Figure 6:
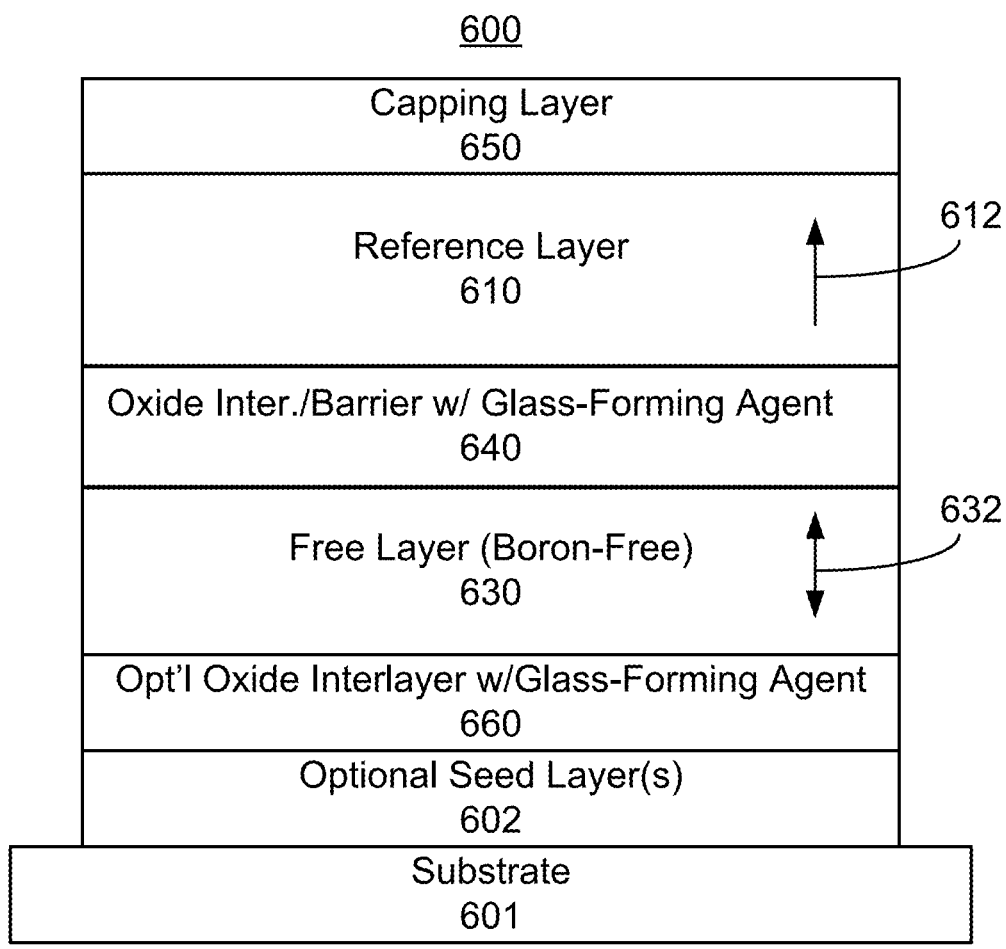
FIG. 6 depicts another embodiment of a magnetic junction having an oxide interlayer including a glass-forming agent and usable in magnetic devices such as a magnetic memory programmable using spin transfer torque.

FIG. 6 depicts another embodiment of magnetic junction 600 having an oxide interlayer including a glass-forming agent. For clarity, FIG. 6 is not to scale. Magnetic junction 600 may be used in a magnetic device such as a STT-MRAM, spin-orbit torque MRAM (SOT-MRAM), logic devices, other integrated circuits and, therefore, in a variety of electronic devices. Magnetic junction 600 resides on substrate 601 and includes optional seed layer(s) 602, reference layer 610 having a magnetic moment 612, free layer 630 having magnetic moment 632, oxide interlayer 640 and optional capping layer 650. In some embodiments, capping layer 650 is a metallic layer. A bottom contact and a top contact are not shown but may be formed. Similarly, polarization enhancement and other layers may be present but are not shown for simplicity. As can be seen in FIG. 6, magnetic junction 600 is a top pinned magnetic junction. Thus, free layer 630 is closer to the underlying substrate (not shown in FIG. 1) than reference layer 610.

Reference layer 610 is magnetic and analogous to reference layer 110. Thus, reference layer 610 may have a perpendicular magnetic anisotropy that exceeds the out-of-plane demagnetization energy. Free layer 630 is analogous to free layer 130. Free layer 630 may, therefore, be a glass-forming agent-free free layer. Thus, free layer 630 may be crystalline. Thus, seed layer(s) 602 may, therefore, include a setting agent. Free layer 130 is magnetic and may include or consists of ferromagnetic materials, such as Fe, Co, CoFe, Co-based Heusler alloys and/or or Mn-based Heusler alloys. Other and/or additional materials may be used in some embodiments. In the embodiment shown, free layer 630 has a high perpendicular magnetic anisotropy. In some embodiments, free layer 630 is thin. For example, the thickness, t, of free layer 630 may be less than thirty Angstroms in some embodiments. In some such embodiments, free layer 630 is not more than fifteen Angstroms thick. In some embodiments, free layer 630 may be at last four Angstroms and not more than eight Angstroms thick. However, other thicknesses are possible. In some embodiments, free layer 630 does not contain glass-forming agents, such as boron, as-deposited. As such, free layer 630 may be crystalline as-deposited.

Oxide interlayer 640 is on free layer 630 and also functions as a tunneling barrier layer. Oxide interlayer 640 also includes a glass-forming agent as discussed with respect to oxide interlayers 140 and 440". Thus, oxide interlayer is analogous to oxide interlayer(s) 140 and 440". However, oxide interlayer 640 is also desired to allow for tunneling magnetoresistance to be developed between reference layer 610 and free layer 630. In some embodiments, oxide interlayer 640 is an oxide of one or more metals, such as Mg, Ti, Ta, Zr, Hf, V and/or Nb. In some such embodiments, oxides of Ta, Zr and/or Hf may form part oxide interlayer 640. Glass-forming agents may include one or more of Si, Be, B, Al, P and Ga. Oxide interlayer 640 includes not more than fifty atomic percent and greater than zero atomic percent of the glass-forming agent(s) in some embodiments. In some embodiments, oxide interlayer 640 includes not more than thirty atomic percent of the glass-forming agent(s). In some embodiments, oxide interlayer 640 includes at least five atomic percent of the glass-forming agent(s). However, other stoichiometries may be possible. In some embodiments, oxide interlayer 660 including glass-forming elements may be present. Oxide interlayer 660 is analogous to oxide interlayer 640, but is between optional seed layer(s) 602 and free layer 630. Oxide interlayer 660 may be used in addition to or in lieu of oxide interlayer 640. In some embodiments, oxide interlayer 660 may be omitted.

Oxide interlayer 640, as well as oxide interlayer 660, may improve the performance of magnetic junction 600. Oxide interlayer 640 may be smooth, continuous, stable, amorphous and thin. Oxide interlayer 660 may be much lower in resistance than oxide interlayer 640. For example, oxide interlayer 660 may have a resistance that is negligible in comparison to that of oxide interlayer 640, which corresponds to a tunneling barrier layer. Consequently, properties such as TMR, stability (e.g. reduced diffusion) and magnetic damping may be improved. Thus, performance of magnetic junction 600 may be improved.

Figure 7:
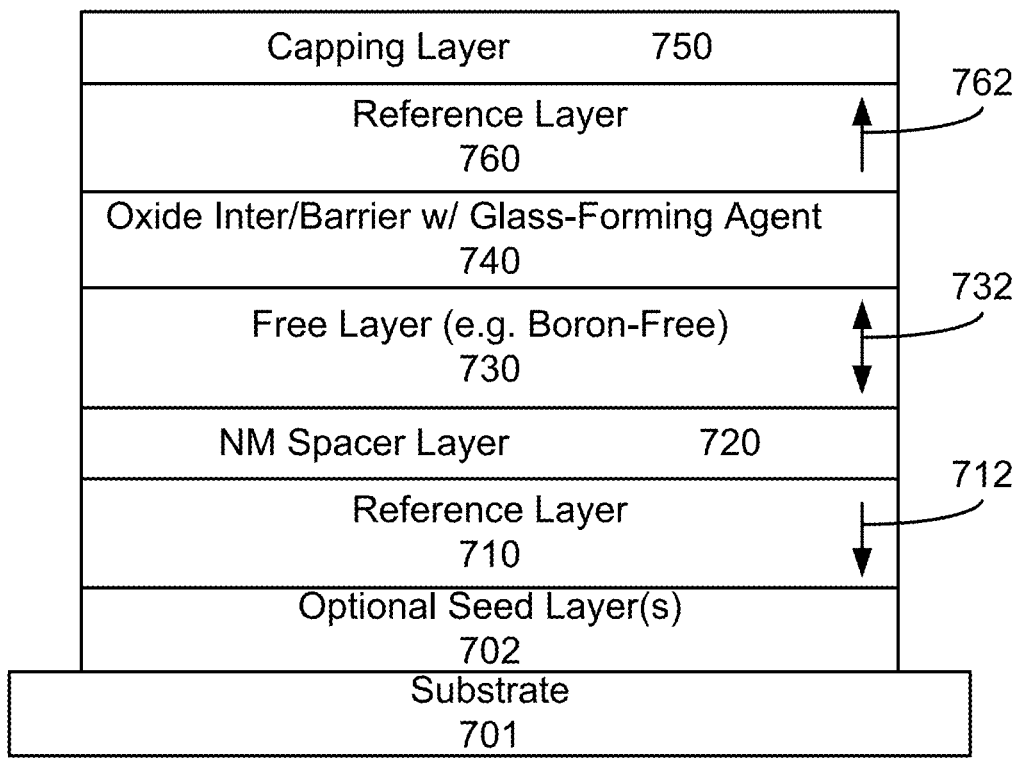
FIG. 7 depicts another embodiment of a magnetic junction having an oxide interlayer including a glass-forming agent and usable in magnetic devices such as a magnetic memory programmable using spin transfer torque.

FIG. 7 depicts another embodiment of magnetic junction 700 having an oxide interlayer including a glass-forming agent. For clarity, FIG. 7 is not to scale. Magnetic junction 700 may be used in a magnetic device such as a STT-MRAM, spin-orbit torque MRAM (SOT-MRAM), logic devices, other integrated circuits and, therefore, in a variety of electronic devices. Magnetic junction 700 resides on substrate 701 and includes optional seed layer(s) 702, reference layer 710 having a magnetic moment 712, nonmagnetic spacer layer 720, free layer 730 having magnetic moment 732, oxide interlayer 740 and optional capping layer 750. In some embodiments, capping layer 750 is a metallic layer. A bottom contact and a top contact are not shown but may be formed. Similarly, polarization enhancement and other layers may be present but are not shown for simplicity. Reference layer 710, nonmagnetic spacer layer 720 and free layer 730 are analogous to reference layer(s) 110/610, nonmagnetic spacer layer 120 and free layer(s) 130/630. Thus, free layer 630 may be a glass-forming agent-free free layer. Reference layer 760 including magnetic moment 762 is analogous to reference layer 710. Thus, magnetic junction 700 is a dual magnetic junction.

Oxide interlayer 740 is on free layer 730 and also functions as a tunneling barrier layer. Oxide interlayer 740 also includes a glass-forming agent as discussed with respect to oxide interlayers 140 and 440". Thus, oxide interlayer is analogous to oxide interlayer(s) 140 and 440". However, oxide interlayer 740 is also desired to allow for tunneling magnetoresistance to be developed between reference layer 760 and free layer 730. Thus, oxide interlayer is also analogous to oxide interlayer 640. In some embodiments, oxide interlayer 740 is an oxide of one or more metals, such as Mg, Ti, Ta, Zr, Hf, V and/or Nb. In some such embodiments, oxides of Ta, Zr and/or Hf may form part oxide interlayer 740. Glass-forming agents may include one or more of Si, Be, B, Al, P and Ga. Oxide interlayer 740 includes not more than fifty atomic percent and greater than zero atomic percent of the glass-forming agent(s) in some embodiments. In some embodiments, oxide interlayer 740 includes not more than thirty atomic percent of the glass-forming agent(s). In some embodiments, oxide interlayer 740 includes at least five atomic percent of the glass-forming agent(s). However, other stoichiometries may be possible.

Oxide interlayer 740 may improve the performance of magnetic junction 700. Oxide interlayer 740 may be smooth, continuous, stable, amorphous and thin. Oxide interlayer 740 may be much lower in resistance than nonmagnetic spacer layer 720. For example, oxide interlayer 740 may have a resistance that is negligible in comparison to that of nonmagnetic spacer layer 720. Consequently, properties such as TMR, stability (e.g. reduced diffusion) and magnetic damping may be improved. Thus, performance of magnetic junction 700 may be improved.

Figure 8:
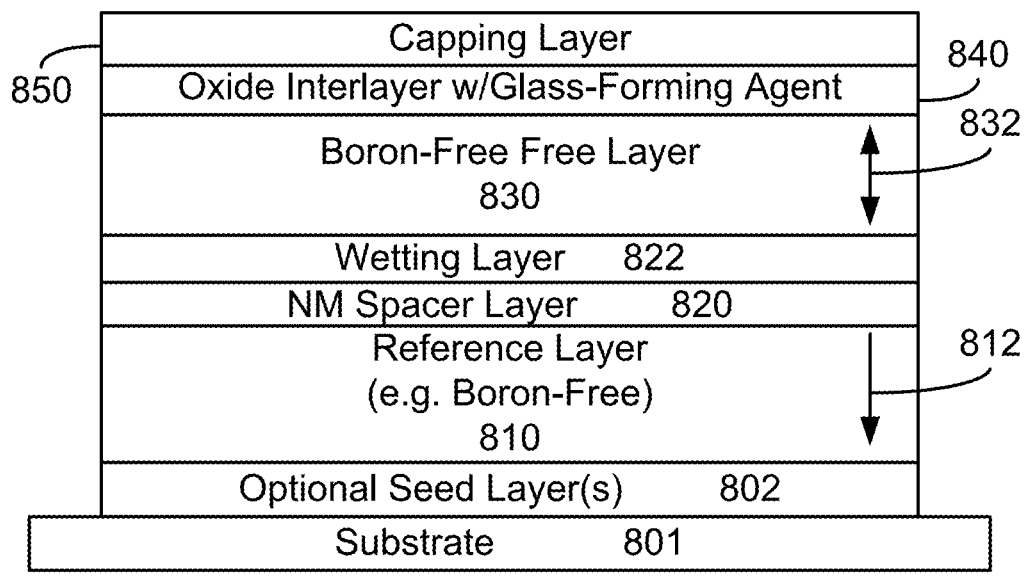
FIG. 8 depicts another embodiment of a magnetic junction having an oxide interlayer including a glass-forming agent and usable in magnetic devices such as a magnetic memory programmable using spin transfer torque.

FIG. 8 depicts another embodiment of magnetic junction 800 having an oxide interlayer including a glass-forming agent. For clarity, FIG. 8 is not to scale. Magnetic junction 800 may be used in a magnetic device such as a STT-MRAM, spin-orbit torque MRAM (SOT-MRAM), logic devices, other integrated circuits and, therefore, in a variety of electronic devices. Magnetic junction 800 resides on substrate 801 and includes optional seed layer(s) 802, reference layer 810 having a magnetic moment 812, nonmagnetic spacer layer 820, free layer 830 having magnetic moment 832, oxide interlayer 840 and optional capping layer 850. In some embodiments, capping layer 850 is a metallic layer. A bottom contact and a top contact are not shown but may be formed. Similarly, polarization enhancement and other layers may be present but are not shown for simplicity. Reference layer 810, nonmagnetic spacer layer 820 and free layer 830 are analogous to reference layer(s) 110/610/710, nonmagnetic spacer layer 120/720 and free layer(s) 130/630/730. In the embodiment shown, free layer 830 may be a glass-forming agent-free free layer. In some embodiments, reference layer 810 may be free of glass-forming agent(s). In the embodiment shown, substrate 801 may be a crystalline substrate such as MgO(001) or Si(001). In some embodiments, layers 802, 810, 820 and 830 are epitaxially grown on single crystalline substrate. In such embodiments, as-deposited layers 802, 810, 820 and 830 should be single crystalline.

Oxide interlayer 840 is on free layer 830 and includes a glass-forming agent as discussed with respect to oxide interlayers 140 and 440". Thus, oxide interlayer is analogous to oxide interlayer(s) 140 and 440". In some embodiments, oxide interlayer 840 is an oxide of one or more metals, such as Mg, Ti, Ta, Zr, Hf, V and/or Nb. In some such embodiments, oxides of Ta, Zr and/or Hf may form part oxide interlayer 840. Glass-forming agents may include one or more of Si, Be, B, Al, P and Ga. Oxide interlayer 840 includes not more than fifty atomic percent and greater than zero atomic percent of the glass-forming agent(s) in some embodiments. In some embodiments, oxide interlayer 840 includes not more than thirty atomic percent of the glass-forming agent(s). In some embodiments, oxide interlayer 840 includes at least five atomic percent of the glass-forming agent(s). However, other stoichiometries may be possible.

Also explicitly shown is wetting layer 822. Wetting layer 822 may be provided via sputtering, physical vapor deposition (PVD) or other appropriate process and is used for glass-forming agent-free free layer 830. Although depicted as a continuous layer wetting layer 822 need not be. Wetting layer 822 includes material(s) that may be used as a precursor to a subsequent magnetic layer. Wetting layer 822 may include or consist of 3d transition metal(s) and/or their alloys. For example, wetting layer 822 might include at least one of elemental Fe, elemental Co, elemental Ni, elemental Mn, an Fe-containing alloy such as CoFe, a Co-containing alloy such as CoFe, a Ni-containing alloy and a Mn containing alloy. Optionally other materials might optionally be included as part of wetting layer 822. However, any elements not included in the subsequent glass-forming agent-free layer may be omitted from wetting layer 822. In some embodiments, the material(s) used for the wetting layer 822 are magnetic. Wetting layer 822 is also thin. In some embodiments, the wetting layer thickness is at least 0.25 monolayer and not more than three monolayers. In some cases, the thickness may be at least 0.5 monolayers and not more than two monolayers. In some such embodiments the wetting layer 204 has a thickness of at least 0.75 monolayer and not more than 1.25 monolayers. A fractional monolayer corresponds to a monolayer having holes therein—that is, a layer single layer that is incomplete.

Oxide interlayer 840 may improve the performance of magnetic junction 800. Oxide interlayer 840 may be smooth, continuous, stable, amorphous and thin. Oxide interlayer 840 may be much lower in resistance than nonmagnetic spacer layer 820. For example, oxide interlayer 840 may have a resistance that is negligible in comparison to that of nonmagnetic spacer layer 820. Consequently, properties such as TMR, stability (e.g. reduced diffusion) and magnetic damping may be improved. Thus, performance of magnetic junction 800 may be improved.

Figure 9:
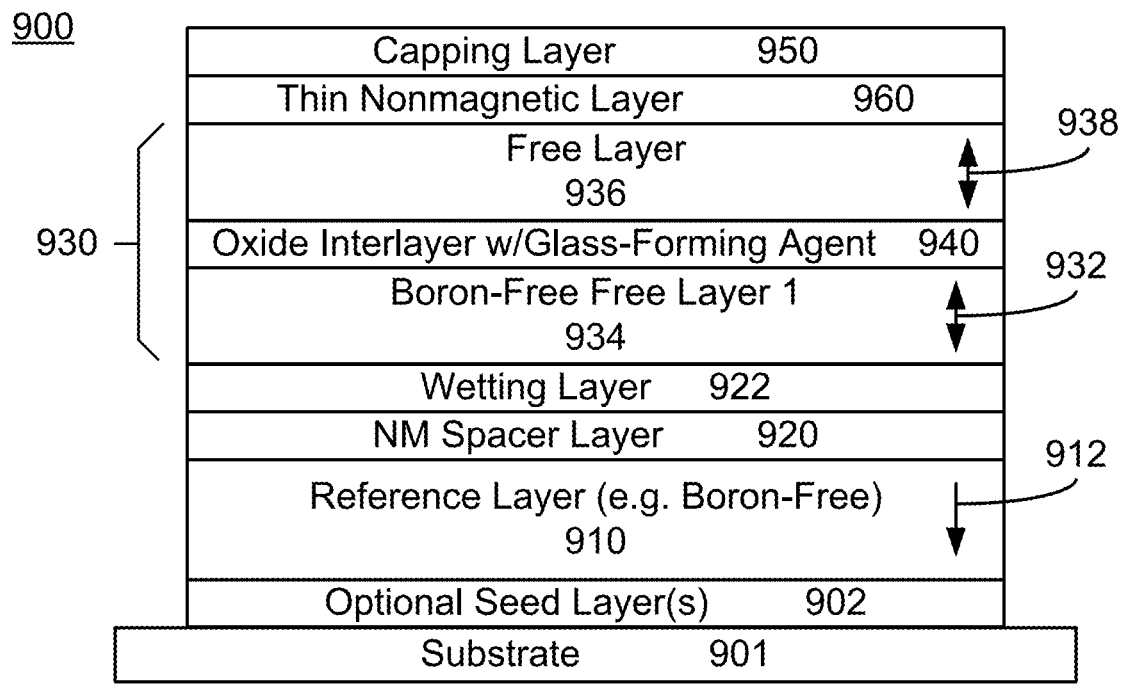
FIG. 9 depicts another embodiment of a magnetic junction having an oxide interlayer including a glass-forming agent and usable in magnetic devices such as a magnetic memory programmable using spin transfer torque.

FIG. 9 depicts another embodiment of magnetic junction 900 having an oxide interlayer including a glass-forming agent. For clarity, FIG. 9 is not to scale. Magnetic junction 900 may be used in a magnetic device such as a STT-MRAM, spin-orbit torque MRAM (SOT-MRAM), logic devices, other integrated circuits and, therefore, in a variety of electronic devices. Magnetic junction 900 resides on substrate 901 and includes optional seed layer(s) 902, reference layer 910 having a magnetic moment 912, nonmagnetic spacer layer 920, optional wetting layer 922, hybrid free layer 930, oxide interlayer 940 and optional capping layer 950. In some embodiments, capping layer 950 is a metallic layer. A bottom contact and a top contact are not shown but may be formed. Similarly, polarization enhancement and other layers may be present but are not shown for simplicity. Reference layer 910, nonmagnetic spacer layer 920 and optional wetting layer 920 are analogous to reference layer(s) 110/610/710/810, nonmagnetic spacer layer 120/720/820 and optional wetting layer 820. In some embodiments, reference layer 910 may be free of glass-forming agent(s).

In the embodiment shown, free layer 930 is a hybrid free layer including layers 934, 940 and 936. First free layer 934 has magnetic moment 932, while second free layer 936 has magnetic moment 938. First free layer 934 and second free layer 936 are magnetically coupled through oxide layer 940. Thus, the magnetic moments 932 and 938 are aligned parallel when magnetic junction 900 is quiescent (e.g. not being written). First free layer 934 is analogous to free layer(s) 130/630/730/830. Thus, first free layer 934 may be a glass-forming agent-free free layer. Oxide interlayer 940 is analogous to oxide interlayers 140, 640, 740 and/or 840. Thus, oxide interlayer 940 is on first free layer 934 and includes a glass-forming agent as discussed with respect to oxide interlayers 140 and 440". Thus, oxide interlayer is analogous to oxide interlayer(s) 140 and 440". In some embodiments, oxide interlayer 940 is an oxide of one or more metals, such as Mg, Ti, Ta, Zr, Hf, V and/or Nb. In some such embodiments, oxides of Ta, Zr and/or Hf may form part oxide interlayer 840. Glass-forming agents may include one or more of Si, Be, B, Al, P and Ga. Oxide interlayer 940 includes not more than fifty atomic percent and greater than zero atomic percent of the glass-forming agent(s) in some embodiments. In some embodiments, oxide interlayer 940 includes not more than thirty atomic percent of the glass-forming agent(s). In some embodiments, oxide interlayer 940 includes at least five atomic percent of the glass-forming agent(s). However, other stoichiometries may be possible. Further, oxide interlayer 940 forms a coupling layer between first free layer 934 and second free layer 936.

Second free layer 936 may be configured as desired. For example, second free layer 936 may be a CoFeB free layer.

Thin nonmagnetic spacer layer 960 may be an insulator or conductive. For example, thin nonmagnetic spacer layer 960 may be an oxide or metallic. The resistance of thin nonmagnetic spacer layer 960 is significantly smaller than the resistance of nonmagnetic spacer layer 920. In some embodiments, the resistance of thin nonmagnetic spacer layer 960 is negligible compared to the resistance of nonmagnetic spacer layer 920.

Oxide interlayer 940 may improve the performance of magnetic junction 900. Oxide interlayer 940 may be smooth, continuous, stable, amorphous and thin. Oxide interlayer 940 may be much lower in resistance than nonmagnetic spacer layer 920. For example, oxide interlayer 940 may have a resistance that is negligible in comparison to that of nonmagnetic spacer layer 920. Consequently, properties such as TMR, stability (e.g. reduced diffusion) and magnetic damping may be improved. Thus, performance of magnetic junction 900 may be improved.

Figure 10:
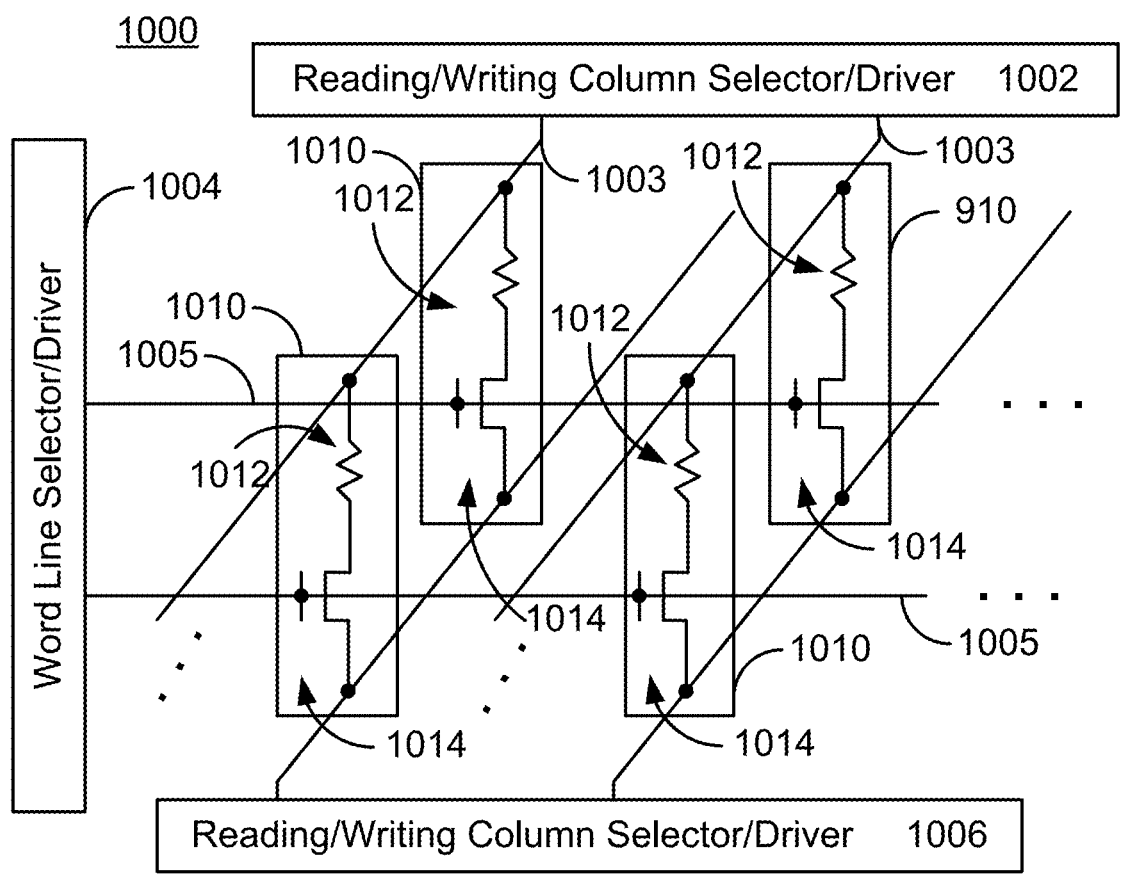
FIG. 10 depicts an exemplary embodiment of a memory utilizing magnetic junctions having glass-forming elements in the oxide layer(s) of the memory element(s) of the storage cell(s).

FIG. 10 depicts an exemplary embodiment of memory 1000 that may use magnetic junctions that have oxide layer(s) including glass-forming agent(s). Memory 1000 may use one or more of the magnetic junctions 100, 400/400'/400", 600, 700, 800, 900 and/or other magnetic junctions including oxide layer(s) having glass-forming agent(s). In other embodiments, the memory may a different configuration and/or that utilize different mechanisms for reading and/or writing to the magnetic junctions. The magnetic memory 1000 includes reading/writing column select drivers 1002 and 1006 as well as word line select driver 1004. Note that other and/or different components may be provided. The storage region of the memory 1000 includes magnetic storage cells 1010. Each magnetic storage cell includes at least one magnetic junction 1012 utilized as a memory element (e.g. to store data) and at least one selection device 1014. Selection devices 1014 are enabled by lines 1005, while lines 1003 are used for magnetic junctions 1012. In some embodiments, the selection device 1014 is a transistor. The magnetic junctions 1012 may be one of the magnetic junctions 100, 400/400'/400", 600, 700, 800, 900 and/or other magnetic junctions including an oxide layer having a glass forming agent. Although one magnetic junction 1012 is shown per cell 1010, in other embodiments, another number of magnetic junctions 1012 may be provided per cell. As such, the magnetic memory 1000 may enjoy the benefits described above.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A magnetic junction, comprising:
   a free layer; and
   an oxide interlayer on the free layer, the oxide interlayer including a metal and at least one glass-forming agent,
   wherein the at least one glass-forming agent is at least five atomic percent and not more than fifty atomic percent in amount based on a total atomic amount of the metal and the at least one glass-forming agent.

2. The magnetic junction of claim 1, further comprising:
   a reference layer; and
   a nonmagnetic spacer layer, the nonmagnetic spacer layer being between the reference layer and the free layer, the free layer being between the nonmagnetic spacer layer and the oxide interlayer.

3. The magnetic junction of claim 1, wherein the free layer is a boron-free free layer.

4. The magnetic junction of claim 1, wherein the oxide interlayer shares an interface with the free layer.

5. The magnetic junction of claim 1, wherein the oxide interlayer includes an oxide of the metal, the metal including at least one of Mg, Ti, Ta, Zr, Hf, V and Nb.

6. The magnetic junction of claim 1, wherein the at least one glass-forming agent is selected from Si, Be, B, Al, P and Ga.

7. The magnetic junction of claim 1, further comprising:
   a substrate, the free layer residing between the oxide interlayer and the substrate.

8. A magnetic device, comprising:
   a plurality of magnetic junctions, each of the plurality of magnetic junctions including a reference layer, a nonmagnetic spacer layer, a free layer and an oxide interlayer on the free layer, the nonmagnetic spacer layer being between the reference layer and the free layer, the free layer being between the nonmagnetic spacer layer and the oxide interlayer, the oxide interlayer including a metal and at least one glass-forming agent; and
   a plurality of conductive lines coupled with the plurality of magnetic junctions,
   wherein the at least one glass-forming agent is at least five atomic percent and not more than fifty atomic percent in amount based on a total atomic amount of the metal and the at least one glass-forming agent.

9. The magnetic device of claim 8, wherein the free layer is a boron-free free layer.

10. The magnetic device of claim 8, wherein the oxide interlayer includes an oxide of the metal, the metal including at least one of Mg, Ti, Ta, Zr, Hf, V and Nb.

11. The magnetic device of claim 8, wherein the at least one glass-forming agent is selected from Si, Be, B, Al, P and Ga.

12. The magnetic device of claim 8, further comprising:
    a substrate, the free layer for each of the plurality of magnetic junctions resides between the oxide interlayer and the substrate.

13. A method for providing a magnetic junction, comprising:
    providing a reference layer;
    providing a nonmagnetic spacer layer;
    providing a free layer; and
    providing an oxide interlayer on the free layer, the oxide interlayer including a metal and at least one glass-forming agent,
    wherein the at least one glass-forming agent is at least five atomic percent and not more than fifty atomic percent in amount based on a total atomic amount of the metal and the at least one glass-forming agent.

14. The method of claim 13, wherein the providing the oxide interlayer includes at least one of a first process and a second process, the first process including
    depositing a metallic layer including the metal and the at least one glass-forming agent; and
    oxidizing the metallic layer;
    the second process including depositing the oxide capping layer.

15. The method of claim 13, wherein the providing the free layer includes providing a boron-free free layer.

16. The method of claim 13, wherein the oxide interlayer includes an oxide of the metal, the metal including at least one of Mg, Ti, Ta, Zr, Hf, V and Nb.

17. The method of claim 13, wherein the at least one glass-forming agent is selected from Si, Be, B, Al, P and Ga.

* * * * *